(12) United States Patent
Kirloskar et al.

(10) Patent No.: US 7,344,920 B1
(45) Date of Patent: Mar. 18, 2008

(54) INTEGRATED CIRCUIT PACKAGE AND METHOD FOR FABRICATING SAME

(75) Inventors: Mohan Kirloskar, Cupertino, CA (US); Katherine Wagenhoffer, Union City, CA (US); Leo M. Higgins, III, Austin, TX (US)

(73) Assignee: ASAT Ltd., Tsuen Wan, New Territories (HK)

( * ) Notice: Subject to any disclaimer, the term of this patent is extended or adjusted under 35 U.S.C. 154(b) by 0 days.

(21) Appl. No.: 11/798,417

(22) Filed: May 14, 2007

Related U.S. Application Data

(62) Division of application No. 11/183,290, filed on Jul. 15, 2005.

(51) Int. Cl.
  *H01L 21/00* (2006.01)
(52) U.S. Cl. .................. 438/123; 438/124; 438/125; 257/666; 257/704; 257/E23.128
(58) Field of Classification Search ............... 438/123, 438/124, 125; 257/E23.128, E23.135, E23.181, 257/E21.193, 704, 666
See application file for complete search history.

(56) References Cited

U.S. PATENT DOCUMENTS

| | | | |
|---|---|---|---|
| 4,530,152 A | 7/1985 | Roche et al. | |
| 4,685,998 A | 8/1987 | Quinn et al. | |
| 4,812,896 A | 3/1989 | Rothgery et al. | |
| 5,066,831 A | 11/1991 | Spielberger | |
| 5,157,480 A | 10/1992 | McShane et al. | |
| 5,200,362 A | 4/1993 | Lin et al. | |
| 5,200,809 A | 4/1993 | Kwon | |
| 5,214,845 A | 6/1993 | King et al. | |
| 5,216,278 A | 6/1993 | Lin et al. | |
| 5,221,642 A | 6/1993 | Burns | |
| 5,273,938 A | 12/1993 | Lin et al. | |
| 5,277,972 A | 1/1994 | Sakumoto et al. | |
| 5,279,029 A | 1/1994 | Burns | |
| 5,293,072 A | 3/1994 | Tsuji et al. | |
| 5,332,864 A | 7/1994 | Liang et al. | |
| 5,343,076 A | 8/1994 | Katayama et al. | |
| 5,406,124 A | 4/1995 | Morita et al. | |

(Continued)

FOREIGN PATENT DOCUMENTS

JP  59-208756  11/1984

OTHER PUBLICATIONS

Neil McLellan et al.; Leadless Plastic Chip Carrier With Etch Back Pad Singulation; U.S. Appl. No. 09/802,678; filed Mar. 9, 2001.

*Primary Examiner*—Long K. Tran
(74) *Attorney, Agent, or Firm*—Morrison & Foerster LLP

(57) ABSTRACT

A process for fabricating an integrated circuit package includes: selectively etching a first side of a substrate thereby providing etched regions of the substrate to partially define at least a plurality of contact pads; adding a dielectric material to the etched regions of the substrate; selectively etching a second side of the substrate to further define at least the plurality of contact pads and thereby provide a package base of at least the contact pads and the dielectric; mounting a semiconductor die to the package base and connecting the semiconductor die to the contact pads; fixing a lid to the package base to cover the semiconductor die in a cavity between the lid and the package base; and singulating to provide the integrated circuit package.

9 Claims, 11 Drawing Sheets

U.S. PATENT DOCUMENTS

| | | |
|---|---|---|
| 5,424,576 A | 6/1995 | Djennas et al. |
| 5,444,301 A | 8/1995 | Song et al. |
| 5,457,340 A | 10/1995 | Templeton, Jr. et al. |
| 5,474,958 A | 12/1995 | Djennas et al. |
| 5,483,099 A | 1/1996 | Natarajan et al. |
| 5,578,869 A | 11/1996 | Hoffman et al. |
| 5,604,376 A | 2/1997 | Hamburgen et al. |
| 5,608,267 A | 3/1997 | Mahulikar et al. |
| 5,639,990 A | 6/1997 | Nishihara et al. |
| 5,640,047 A | 6/1997 | Nakashima |
| 5,641,997 A | 6/1997 | Ohta et al. |
| 5,646,831 A | 7/1997 | Manteghi |
| 5,650,663 A | 7/1997 | Parthasarathi |
| 5,683,806 A | 11/1997 | Sakumoto et al. |
| 5,696,666 A | 12/1997 | Miles et al. |
| 5,701,034 A | 12/1997 | Marrs |
| 5,710,064 A | 1/1998 | Song et al. |
| 5,710,695 A | 1/1998 | Manteghi |
| 5,777,382 A | 7/1998 | Abbott et al. |
| 5,894,108 A | 4/1999 | Mostafazadeh et al. |
| 5,976,912 A | 11/1999 | Fukutomi et al. |
| 6,001,671 A | 12/1999 | Fjelstad |
| 6,008,068 A * | 12/1999 | Yamada ...................... 438/111 |
| 6,057,601 A | 5/2000 | Lau et al. |
| 6,124,637 A | 9/2000 | Freyman et al. |
| 6,194,786 B1 | 2/2001 | Orcutt |
| 6,229,200 B1 | 5/2001 | McLellan et al. |
| 6,294,830 B1 | 9/2001 | Fjelstad |
| 6,306,685 B1 | 10/2001 | Liu et al. |
| 6,459,163 B1 | 10/2002 | Bai |
| 6,489,557 B2 | 12/2002 | Eskildsen et al. |
| 6,498,099 B1 | 12/2002 | McLellan et al. |
| 6,528,877 B2 | 3/2003 | Ernst et al. |
| 6,585,905 B1 | 7/2003 | Fan et al. |
| 6,635,957 B2 | 10/2003 | Kwan et al. |
| 6,762,118 B2 | 7/2004 | Liu et al. |
| 7,070,340 B2 | 7/2006 | Crane et al. |
| 2003/0015780 A1 | 1/2003 | Kang et al. |
| 2003/0183920 A1 | 10/2003 | Goodrich et al. |

* cited by examiner

INTEGRATED CIRCUIT PACKAGE AND METHOD FOR FABRICATING SAME

CROSS-REFERENCE TO RELATED APPLICATION

This application is a divisional application of U.S. Ser. No. 11/183,290, filed Jul. 15, 2005, the entirety of which is referenced herein.

FIELD OF THE INVENTION

The present invention relates generally to integrated circuit packaging and more particularly to a thin array plastic package and a process for fabricating the thin array plastic package.

BACKGROUND OF THE INVENTION

An etch back process for fabricating an integrated circuit package is disclosed in U.S. Pat. No. 6,498,099, assigned to the assignee of the present application, the entire contents of which are incorporated herein by reference. According to this process, a copper substrate strip is first subjected to a partial etch on one of both of the top and bottom surfaces to create a pattern of contact leads (pads) and a die attach pad (paddle). After wire bonding the contacts to a singulated semiconductor de, followed by overmolding and curing of the mold, the leadframe strip is exposed to a second immersion etch for exposing the contact pads in an array pattern (i.e., multi-row) or perimeter pattern (i.e., single row), as well as the die attach pad. In the case of a package with multi-row I/O leads, this etch back step eliminates the previously required two additional saw singulation operations (i.e., to sever the inner leads from the outer leads), and in both the single-row and multi-row configurations, the etch back step eliminates the previously required post mold processing steps (e.g., mold deflashing) and ensures superior device yield over prior processing techniques. Additionally, this technique allows for high I/O pad density and pad standoff from the package bottom, thereby reducing stress in the solder joint during PCB temp cycling. Further, the technique allows for the use of a pre-singulation strip testing technique since the electrical I/O pads are isolated from each other. This feature greatly increases the handling and throughput of the test operation as compared to prior processes.

According to co-pending U.S. patent application Ser. No. 09/802,678 for a Leadless Plastic Chip Carrier With Etch Back Pad Singulation, assigned to the assignee of the present application, the entire contents of which are incorporated herein by reference, a build up fabrication process is provided. The build up process is carried out on a copper substrate strip. Metal layers are selectively plated up on the copper substrate strip to provide build-up die attach pads, each circumscribed by at least one row of contact pads (I/P pads) on the copper strip. Semiconductor dice are fixed to respective die attach pads and gold wires are bonded between pads of the semiconductor dice and respective contact pads. The packages are then molded by placing the substrate strip in a mold. Following molding of the packages, the copper substrate strip is etched away to expose the die attach pad and the contact pads of each package.

These processes provide advantages not previously realized in the art. However, further developments in IC packaging are driven by specific applications and continued demand for improved reliability, electrical performance, decreased size and cost of manufacture.

SUMMARY OF THE INVENTION

According to one aspect of the present application, there is provided a process for fabricating an integrated circuit package. The process includes: selectively etching a first side of a substrate thereby providing etched regions of the substrate to partially define at least a plurality of contact pads; adding a dielectric material to the etched regions of the substrate; selectively etching a second side of the substrate to further define at least the plurality of contact pads and thereby provide a package base of at least the contact pads and the dielectric: mounting a semiconductor die to the package base and connecting the semiconductor die to the contact pads; fixing a lid to the package base to cover the semiconductor die in a cavity between the lid and the package base; and singulating to provide the integrated circuit package.

In accordance with another aspect of the present invention, there is provided an integrated circuit package that includes a package base including a non-conductive material and a plurality of contact pads extending through and protruding from the non-conductive material; a semiconductor die mounted to the package base and electrically connected to various ones of the contact pads; and a lid fixed to the package base and covering the semiconductor die in a cavity between the lid and the package base.

Advantageously, integrated circuit package according to embodiments of the present invention includes an air cavity through which the wire bonds travel. Thus, the wires between the semiconductor die and the contact pads span an air gap rather than traveling through mold compound. The air has a lower dielectric constant than mold compound and therefore the electrical impedance of the gold wire is much lower when the wire runs through air rather than through mold compound. Thus signal distortion at high frequencies is inhibited. Additionally, semiconductor dice that are sensitive to pressure, including MEMS (micro electromechanical systems), GaAs dice etc. are less likely to be damaged during assembly as there is no molding material molded in a pressurized molding step.

Also, the die attach pad provides a good thermal path for thermal dissipation from the semiconductor die. The contact pads allow for different design variations since there is no lead connection as in the leadless plastic chip carrier. In the embodiment including the moat around each contact pad, signals are shielded by grounding for increased electrical performance.

BRIEF DESCRIPTION OF THE DRAWINGS

The present invention will be better understood with reference to the drawings and the following description, in which.

DETAILED DESCRIPTION OF THE PREFERRED EMBODIMENTS

Figure 1A:
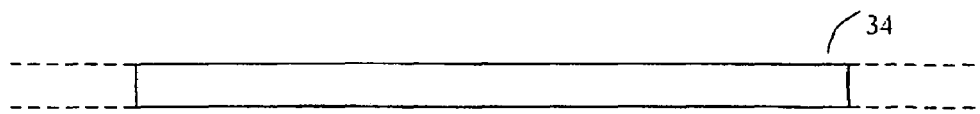
FIGS. 1A to 1J show processing steps for fabricating an integrated circuit package according to an embodiment of the present invention.
Figure 1B:
Figure 1C:
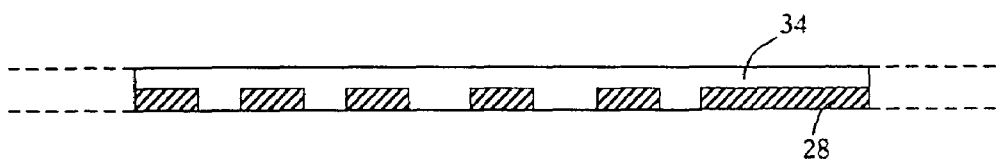
Figure 1D:
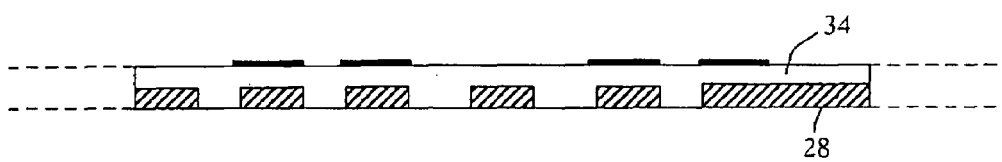
Figure 1E:
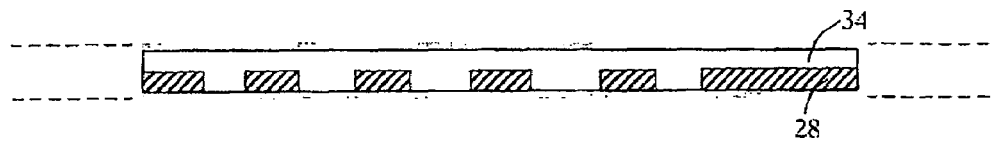
Figure 1F:
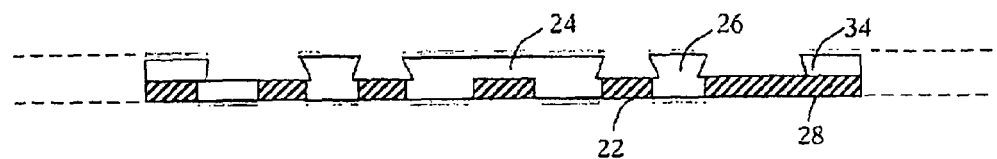
Figure 1G:
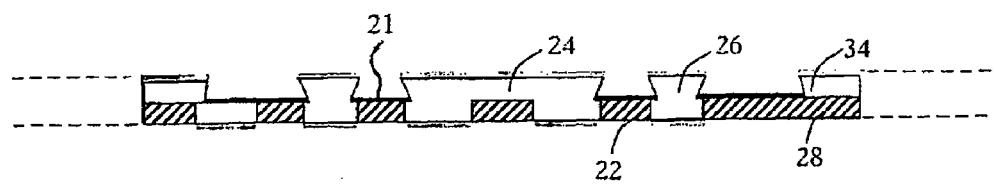
Figure 1H:
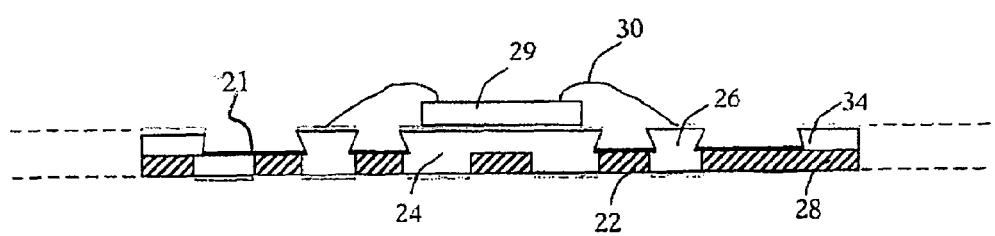
Figure 1I:
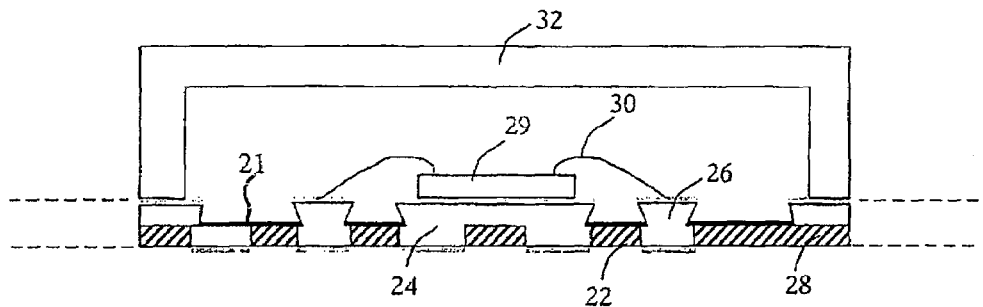
Figure 1J:
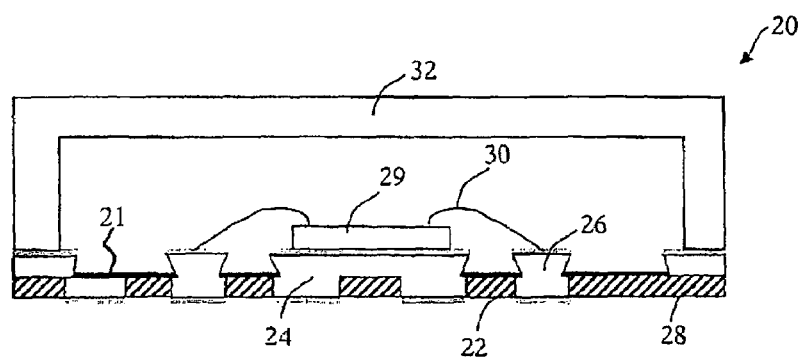

Reference is made to FIGS. 1A to 1J to describe a process for manufacturing an integrated circuit package according to one embodiment of the present invention and indicated generally by the numeral 20. The integrated circuit package 20 is best shown in FIG. 1J and includes a package base 22 that includes a die attach pad 24 and a plurality of contact pads 26 in a non-conductive material 28. A semiconductor die 29 is mounted to the die attach pad 24 and wire bonds 30 connect the semiconductor die 29 to various ones of the contact pads 26. A lid 32 is fixed to the package base 22 and covers the semiconductor die 29 and the wire bonds 30.

A process for manufacturing the integrated circuit package 20 will now be described in more detail, with continued reference to FIGS. 1A to 1J. FIG. 1A shows a sectional side view of a Cu (copper) panel substrate 34 which forms the raw material of a leadframe strip. As discussed in detail in Applicant's own U.S. Pat. No. 6,229,200, the leadframe strip includes a plurality of sections, each of which incorporates a plurality of leadframe units in an array (e.g. 3×3 array or 5×5 array, etc.). Only one such whole unit is depicted in the elevation view of FIG. 1A, portions of adjacent units being shown in stippled lines. It will be appreciated that the adjacent units of the leadframe strip are similar to the unit depicted.

Referring now to FIG. 1B, a photo-imageable etch-resistant mask is deposited on a first side of the copper substrate 34. The photo-imageable etch-resistant mask is spin-coated on the copper substrate 34, selectively exposed using a photo-tool and developed to expose portions of the first side of the substrate 34. The substrate 34 is then etched, for example, by pressurized spray etching, to partially pattern the die attach pad 24 and the contact pads 26. The photo-imageable etch-resistant mask is then stripped away using conventional means. The resulting substrate 34 is shown in FIG. 1B.

The etched away portions of the substrate 34 are then filled with a suitable dielectric (non-conductive) material 28. In the present embodiment, the etched away portions of the substrate 34 are filled with a liquid crystal polymer by locating the substrate 34 in a mold and injecting the liquid crystal polymer to fill out the etched away portions of the substrate 34, as shown in FIG. 1C.

The second side of the substrate 34 is selectively plated with a suitable metal or metals to act as an etch resist and suitable for wire bonding. Suitable metals include, for example, silver (Ag) or nickel and palladium (Ni/Pd) or nickel and gold (Ni/Au). To selectively plate with Ag, Ni/Pd or Ni/Au, a plating mask is first added to the second surface of the substrate 34. As will be appreciated, the plating mask is a photo-imageable plating mask and is applied to the entire top surface of the substrate 34. The photo-imageable plating mask is then imaged with a photo-tool by exposure to ultraviolet light masked by the photo-tool. The photo-imageable plating mask is then developed to provide the pattern with exposed areas of the substrate 34, as shown in FIG. 1D.

After patterning the plating mask, the second side of the substrate 34 is then plated with the suitable metal or metals for facilitating wire bonding and acting as an etch resist during subsequent etching. The remainder of the plating mask is then stripped away to provide the selectively plated substrate 34 shown in FIG. 1E. As shown, the metal is plated on the first side of the substrate 34 and on selected portions of the second side of the substrate 34 without plating the dielectric material 28.

The substrate 34 is then immersion or pressurized spray etched to fully pattern the die attach pad 24 and the contact pads 26. As shown in FIG. 1F, the etching results in a package base including the contact pads, 26, the die attach pad 24 and the dielectric (non-conductive material 28). As shown, the second side of the dielectric material 28 is exposed after etching.

Next, a barrier layer 21 is deposited on the second side of the dielectric material 28 and on edge or surrounding portions of the die attach pad 24 and the contact pads 26 (FIG. 1G). In the present embodiment, a barrier layer 21 of, for example, a soldermask is added to provide improved performance in terms of radio frequency or electromagnetic interference.

A singulated semiconductor die 29 is then mounted to the die attach pad 24, on the second side of the substrate 34 using known means such as epoxy mounting followed by curing of the epoxy. Next, gold wire bonds 30 are bonded between the semiconductor die 29 and the contact pads 26 to electrically connect pads of the semiconductor die 29 to the contact pads 26 (FIG. 1H).

After mounting to the die attach pad 24 and electrically connecting the semiconductor die 29 to the contact pads 26, a lid 32 is fixed to the package base to cover the semiconductor die 29 and wire bonds 30, as shown in FIG. 1I. In the present embodiment, the lid 32 is made of liquid crystal polymer (LCP) and is pre-formed to include sidewalls and a top extending between the sidewalls. The sidewalls are fixed to the plated substrate 34, around a periphery of the integrated circuit package 20. The sidewalls are fixed to the plated substrate 34 using suitable means such as epoxy.

Singulation of the individual integrated circuit package 20 is then performed either by saw singulation or die punching. In the present embodiment, the individual integrated circuit package 20 is saw singulated to provide the integrated circuit package shown in FIG. 1J.

Figure 2A:
FIGS. 2A to 2J show processing steps for fabricating an integrated circuit package according to another embodiment of the present invention.
Figure 2B:
Figure 2C:
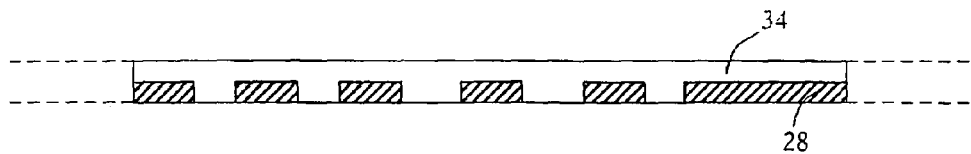

Referring now to FIGS. 2A to 2J, processing steps for fabricating an integrated circuit package according to another embodiment of the present invention, are shown. The fabrication steps shown in FIGS. 2A to 2C are similar to the fabrication steps described above with reference to FIGS. 1A to 1C and therefore need not be further described herein.

Figure 2D:
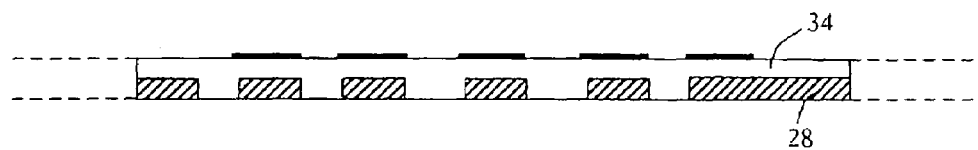
Figure 2E:
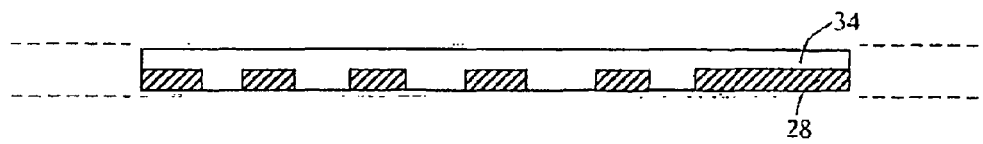

In the embodiment shown in FIGS. 2A to 2J, rather than a single die attach pad 24, a plurality of die attach pads 24 are provided. As shown in FIG. 2D, the second side of the substrate 34 is selectively plated with a suitable metal or metals to act as an etch resist. As in the first-described embodiment, a plating mask is first added to the second surface of the substrate 34. As will be appreciated, the plating mask is a photo-imageable plating mask and is applied to the entire top surface of the substrate 34. The photo-imageable plating mask is then imaged with a photo-tool by exposure to ultraviolet light masked by the photo-tool. The photo-imageable plating mask is developed to provide the pattern with exposed areas of the substrate 34, as shown in FIG. 2D After patterning the plating mask, the second side of the substrate 34 is plated with the suitable metal to act as an etch resist during subsequent etching. The remainder of the plating mask is then stripped away to provide the selectively plated substrate 34. As shown in FIG. 2E, the metal is plated on the first side of the substrate 34 and on selected portions of the second side of the substrate 34 without plating the dielectric material 28.

Figure 2F:
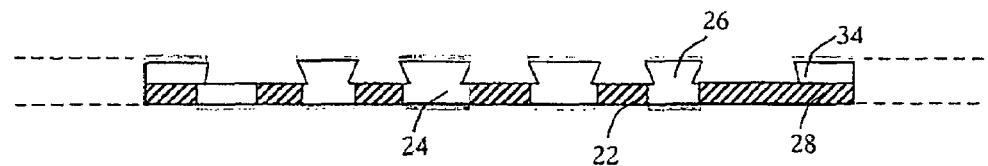

The substrate 34 is immersion or pressurized spray etched to fully pattern the plurality of die attach pads 24 and the contact pads 26 (FIG. 2F). The etching results in a package base including the contact pads 26, the plurality of die attach pads 24 and the dielectric (non-conductive material 28). As shown, the second side of the dielectric material 28 is exposed after etching.

Figure 2G:
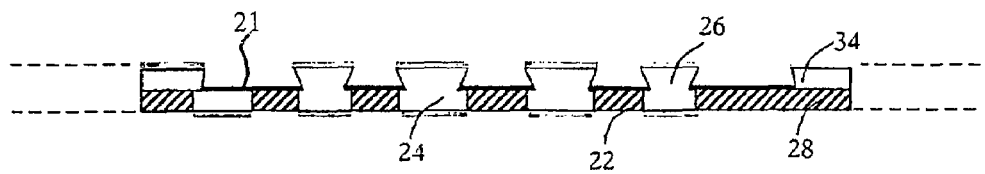

Next, a barrier layer 21 is deposited on the second side of the dielectric material 28 and on edge or surrounding portions of each of the die attach pads 24 and the contact pads 26 (FIG. 2G). In the present embodiment, a barrier layer 21 of liquid crystal polymer is added to provide a moisture barrier.

Figure 2H:
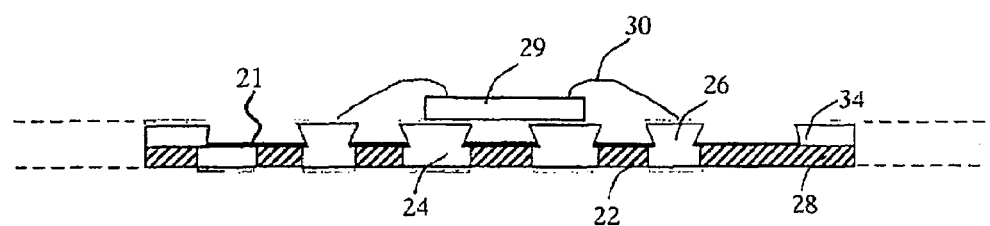

A singulated semiconductor die 29 is then mounted to the die attach pads 24, on the second side of the substrate 34 using known means such as epoxy mounting followed by curing of the epoxy. Gold wire bonds 30 are then bonded between the semiconductor die 29 and the contact pads 26 to electrically connect pads of the semiconductor die 29 to the contact pads 26 (FIG. 2H).

Figure 2I:
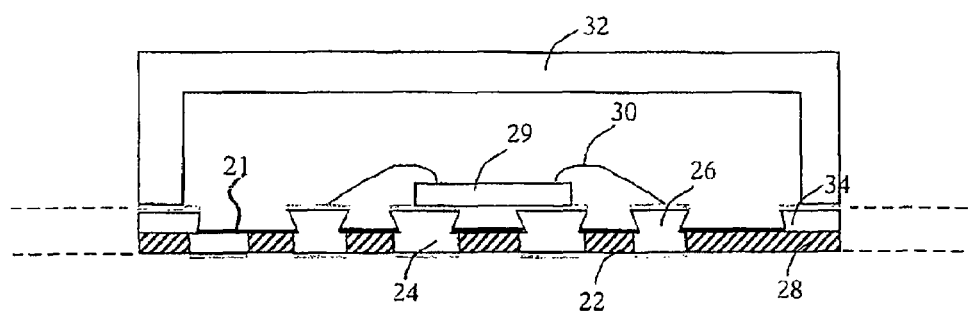
Figure 2J:
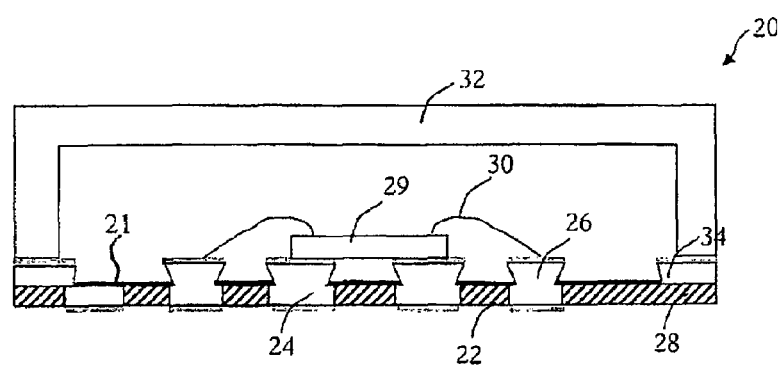

After mounting to the die attach pads 24 and electrically connecting the semiconductor die 29 to the contact pads 26, a lid 32 is fixed to the package base to cover the semiconductor die 29, as shown in FIG. 2I. In the present embodiment, the lid 32 is made of liquid crystal polymer and is pre-formed to include sidewalls and a top extending between the sidewalls. The sidewalls are fixed to the plated substrate 34, around a periphery of the integrated circuit package 20.

Singulation of the individual integrated circuit package 20 is then performed either by saw singulation or die punching. In the present embodiment, the individual integrated circuit package 20 is saw singulated to provide the integrated circuit package shown in FIG. 2J.

Referring now to FIGS. 3A to 3J, processing steps for fabricating an integrated circuit package according to another embodiment of the present invention, are shown. The fabrication steps shown in FIGS. 3A to 3G are similar to the fabrication steps described above with reference to FIGS. 2A to 2G and therefore need not be further described herein. In the present embodiment, however, the semiconductor die 29 is mounted to the opposite side of the die attach pad 24, on the first side of the substrate 34 (FIG. 3H), rather than the second side as described in the embodiment described above with reference to FIG. 2H. Gold wire bonds 30 are then bonded between the semiconductor die 29 and the contact pads 26 on the second side of the substrate 34.

Figure 3A:
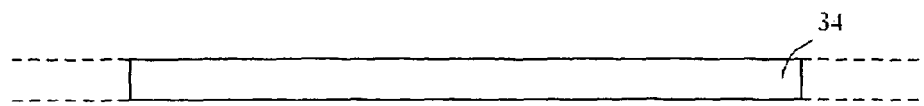
FIGS. 3A to 3J show processing steps for fabricating an integrated circuit package according to yet another embodiment of the present invention.
Figure 3B:
Figure 3C:
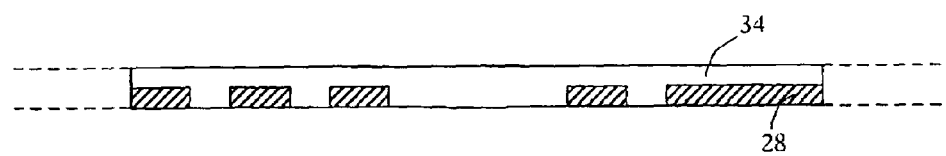
Figure 3D:
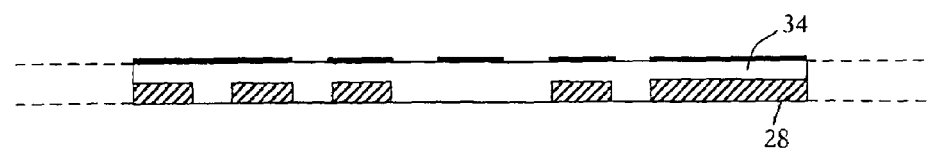
Figure 3E:
Figure 3F:
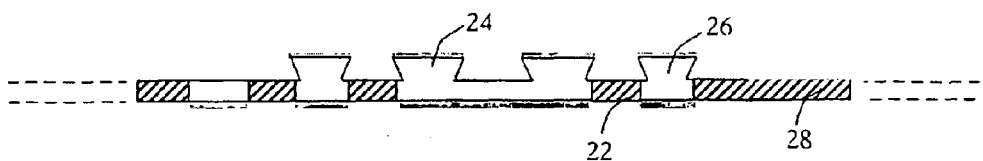
Figure 3G:
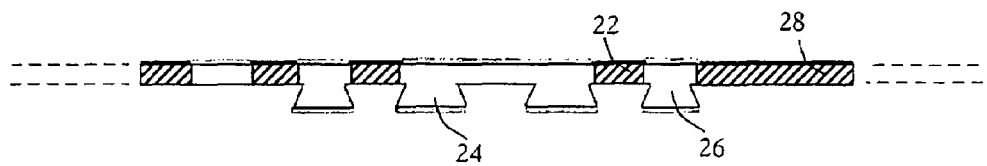
Figure 3H:
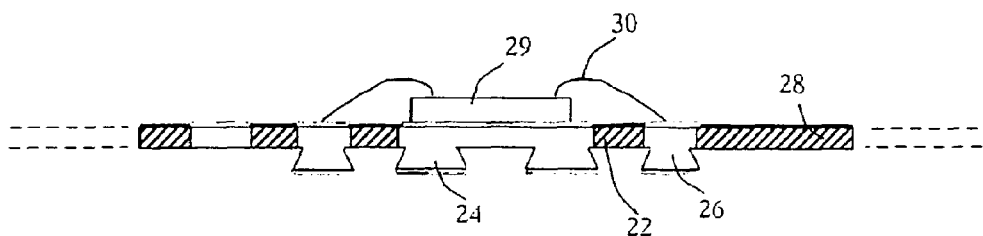
Figure 3I:
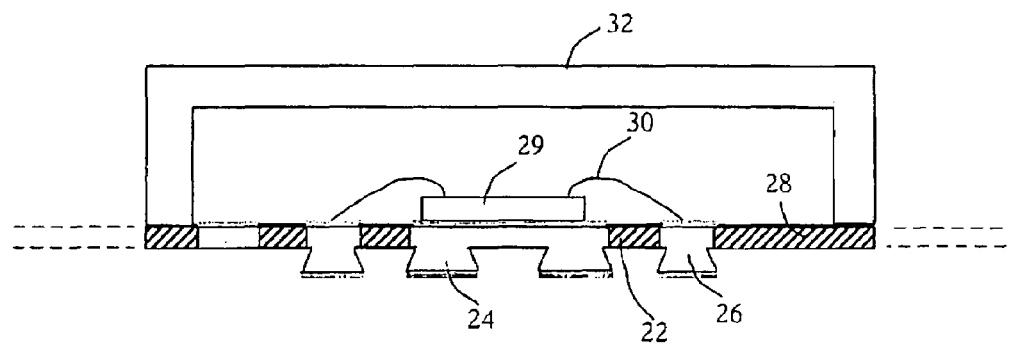
Figure 3J:
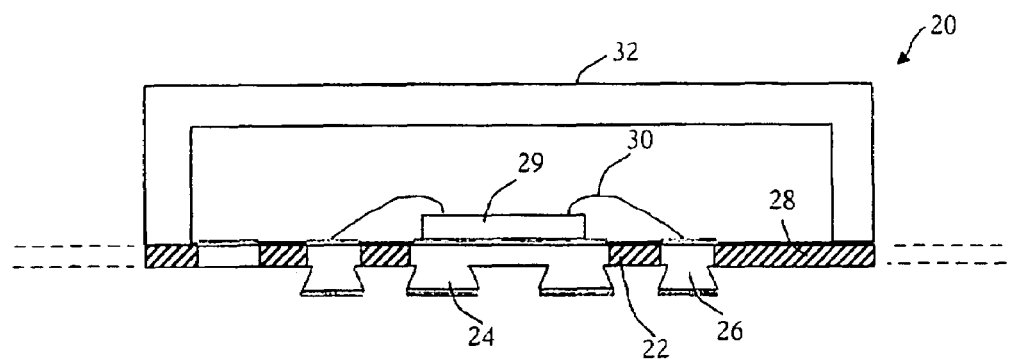

After mounting to the die attach pad 24 and electrically connecting the semiconductor die 29 to the contact pads 26, a lid 32 is fixed to the package base to cover the semiconductor die 29 and wire bonds 30, as shown in FIG. 3I. Singulation of the individual integrated circuit package 20 is then performed (FIG. 3J).

Figure 4:
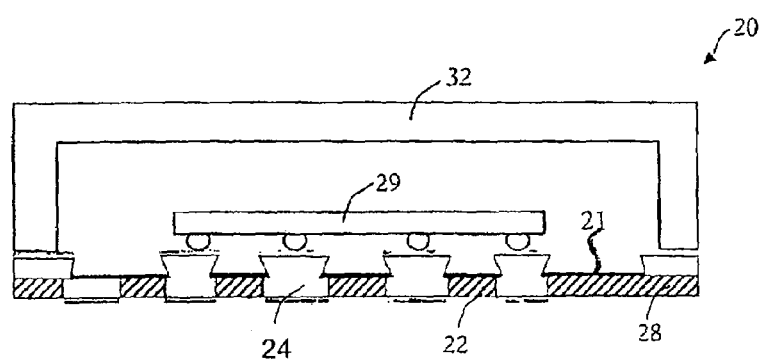
FIG. 4 shows an integrated circuit package fabricated in accordance with still another embodiment of the present invention.

Specific embodiments of the present invention have been shown and described herein. However, modifications and variations to these embodiments are possible. For example, rather than mounting the semiconductor die and then wire bonding as described in the embodiment shown in FIGS. 2A to 2J, a singulated semiconductor die 29 can be mounted in a flip-chip orientation to the package base. It will be appreciated that the die attach pads 24 act as contact pads to which the pads of the semiconductor die 29 are connected using solder balls. The solder balls are placed on the contact pads using known pick and place and reflow techniques. It will be appreciated that the pads of the semiconductor die 29 align with the contact pads of the package base and the solder balls electrically connect the semiconductor die 29 with the contact pads. The area under the semiconductor die 29 is filled with a thermosetting plastic compound, referred to generally as an underfill material. The underfill material surrounds the solder balls that connect the semiconductor die 29 and the contact pads and serves to absorb some of the thermally induced stresses. The resulting package is shown in FIG. 4.

Figure 5A:
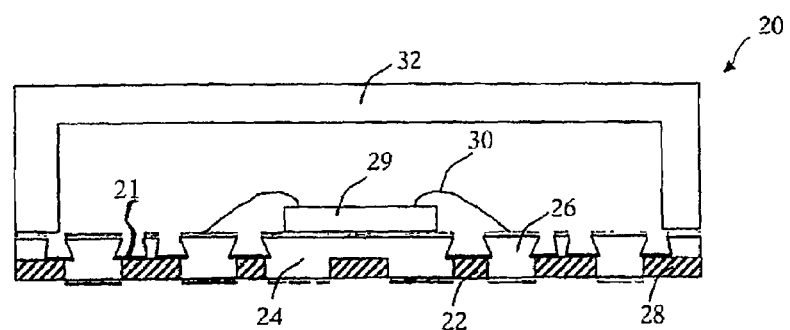
FIG. 5A shows an integrated circuit package fabricated in accordance with yet another embodiment of the present invention.
Figure 5B:
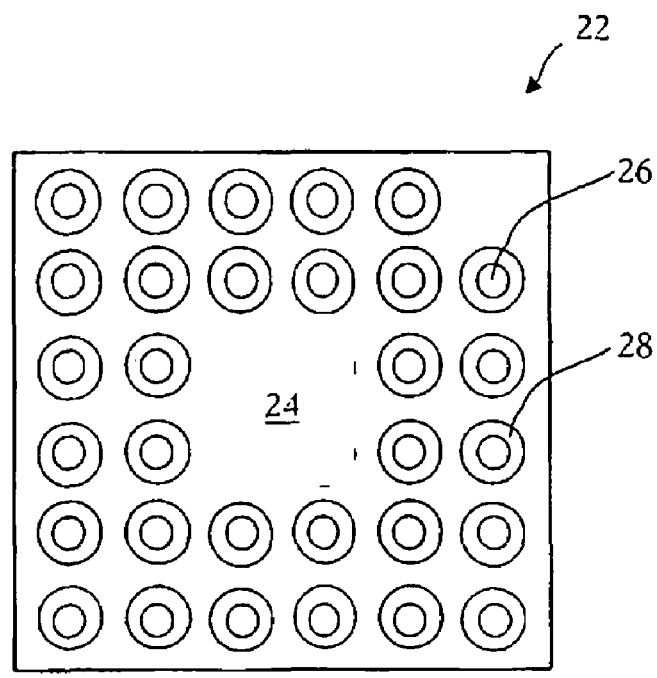
FIG. 5B shows a top view of a package base including contact pads, die attach pad and non-conductive material, at a step during fabrication of the integrated circuit package of FIG. 5A, prior to mounting a singulated semiconductor die.

FIGS. 5A and 5B show another embodiment of an integrated circuit package and a top view of a package base including contact pad, die attach pad and non-conductive material, at a step during fabrication of the integrated circuit package of FIG. 5A, prior to mounting a singulated semiconductor die. The integrated circuit package 20 shown in FIG. 5A includes two rows of contact pads 26 circumscribing the semiconductor die 29 and die attach pad 24. Each contact pad 26 is surrounded by a moat, separating the metal of the contact pads 26 and the surrounding metal of the package base.

Other modifications and variations are possible. For example, rather than filling out the etched away portions of the substrate by molding liquid crystal polymer, the etched away portions can be filled by screen printing or laminating any suitable dielectric material. Also, in the above-described embodiments, a soldermask barrier layer is deposited. It will be understood that this barrier layer is optional and further, other barrier layers can be used such as liquid crystal polymer to provide a moisture barrier. Advantageously, a liquid crystal polymer layer also improves adhesion and reliability. Also, other materials are possible for a barrier layer, for example to dampen or enhance radio frequency or electromagnetic interference. Rather than mounting the semiconductor die to the die attach pad using epoxy, other suitable mounting means can be used. Further, in the above-described embodiments, the lid is described as being liquid crystal polymer. Other lid materials such as glass, metal and ceramic are possible, however. The lid can be fixed to a periphery of the integrated circuit package using any suitable means such as epoxy or solder. Rather than using a photo-imageable etch-resistant mask on the copper substrate 34, as described with reference to, for example. FIG. 1B, an etch-resistant metal such as gold can be used by applying a plating mask, plating gold, removing the plating mask and etching.

Still other modifications and variations may occur to those skilled in the art. All such modifications and variations are believed to be within the sphere and scope of the present invention.

What is claimed is:

1. A process for fabricating an integrated circuit package comprising:
   selectively etching a first side of a substrate thereby providing etched regions of said substrate to partially define at least a plurality of contact pads;
   adding a dielectric material to said etched regions of said substrate;
   selectively etching a second side of said substrate to further define the plurality of contact pads and thereby provide a package base of at least the contact pads and said dielectric; wherein selectively etching said second side of said substrate comprises:

providing a plating resist on selected portions of said second side of said substrate;
plating said etch-resist on said second side of said substrate, between said selected portions of said second side of said substrate;
stripping said plating resist to expose said selected portions of said second side of said substrate; and
etching said selected portions of said second side of said substrate,
mounting a semiconductor die to said package base and connecting said semiconductor die to said contact pads;
fixing a lid to said package base to cover said semiconductor die in a cavity between said lid and said package base; and singulating to provide said integrated circuit package.

2. The process according to claim 1, wherein said selectively etching a first side of said substrate comprises selectively etching to partially define a plurality of contact pads and a die attach pad and wherein selectively etching a second side of said substrate comprises selectively etching to further define the contact pads and the die attach pad.

3. The process according to claim 2, wherein mounting a semiconductor die to said package base and connecting said semiconductor die to said contact pads comprises mounting said semiconductor die to said die attach pad and wire bonding said semiconductor die to ones of said contact pads.

4. The process according to claim 1, wherein adding said dielectric comprises molding a liquid crystal polymer in said etched regions.

5. The process according to claim 1, wherein adding said dielectric comprises one of screen printing and laminating said dielectric in said etched regions.

6. The process according to claim 1, further comprising depositing a barrier on a side of said dielectric, prior to fixing said lid to said package base.

7. The process according to claim 6, wherein depositing said barrier comprises depositing a liquid crystal polymer.

8. The process according to claim 6, wherein depositing said barrier comprises depositing a soldermask.

9. The process according to claim 1, wherein selectively etching said first side of said substrate comprises:
depositing a photo-imageable etch-resistant mask on said first side of said substrate;
imaging and developing said mask to expose portions of said first side of said substrate; and
etching said first side of said substrate to thereby etch said exposed portions of said first side of said substrate.

* * * * *